US012514081B2

(12) United States Patent
Xue et al.

(10) Patent No.: US 12,514,081 B2
(45) Date of Patent: Dec. 30, 2025

(54) DISPLAY SUBSTRATE, METHOD FOR FORMING THE SAME AND DISPLAY DEVICE

(71) Applicant: BOE TECHNOLOGY GROUP CO., LTD., Beijing (CN)

(72) Inventors: Jinxiang Xue, Beijing (CN); Zhongyuan Sun, Beijing (CN); Wenqi Liu, Beijing (CN); Che An, Beijing (CN); Jingkai Ni, Beijing (CN); Fang Liu, Beijing (CN); Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 485 days.

(21) Appl. No.: 18/245,142

(22) PCT Filed: Apr. 18, 2022

(86) PCT No.: PCT/CN2022/087444
§ 371 (c)(1),
(2) Date: Mar. 13, 2023

(87) PCT Pub. No.: WO2023/201473
PCT Pub. Date: Oct. 26, 2023

(65) Prior Publication Data
US 2024/0306447 A1    Sep. 12, 2024

(51) Int. Cl.
*H10K 59/131*    (2023.01)
*H10K 59/12*    (2023.01)
*H10K 59/121*    (2023.01)

(52) U.S. Cl.
CPC ....... *H10K 59/131* (2023.02); *H10K 59/1201* (2023.02); *H10K 59/1213* (2023.02)

(58) Field of Classification Search
CPC ............ H10K 59/131; H10K 59/1201; H10K 59/1213
USPC .......................... 257/40, 59, 72, 91, 99, 100
See application file for complete search history.

(56) References Cited

U.S. PATENT DOCUMENTS

| 11,349,089 | B2 * | 5/2022 | Park ..................... H10K 59/124 |
| 11,699,364 | B2 * | 7/2023 | Sui ....................... H10K 59/131 |
| | | | 361/679.01 |
| 11,737,320 | B2 * | 8/2023 | Park ..................... H10D 86/451 |
| | | | 257/40 |

(Continued)

FOREIGN PATENT DOCUMENTS

| CN | 101692483 A | 4/2010 |
| CN | 103715205 A | 4/2014 |

(Continued)

*Primary Examiner* — Eric W Jones
(74) *Attorney, Agent, or Firm* — McCoy Russell LLP

(57) ABSTRACT

A display substrate includes: a base substrate including a plurality of islands, a plurality of connection bridges, a plurality of display units each including a first electrode, a second electrode and an electroluminescent layer and an electrical connection unit including a plurality of signal lines arranged on the connection bridges. At least one annular electrode is further arranged on each island. The annular electrode includes a first region and a second region. A line width of the annular electrode in the first region is larger than a line width the annular electrode in the second region, or the second region is a hollowed-out region.

20 Claims, 15 Drawing Sheets

(56) References Cited

U.S. PATENT DOCUMENTS

| | | | |
|---|---|---|---|
| 12,349,560 B2* | 7/2025 | Park | .................... H10K 59/124 |
| 2020/0335573 A1 | 10/2020 | Kimura | |
| 2020/0388666 A1 | 12/2020 | Park et al. | |
| 2021/0005700 A1 | 1/2021 | Park et al. | |
| 2022/0181422 A1 | 6/2022 | Gao et al. | |
| 2022/0328604 A1 | 10/2022 | Yang et al. | |

FOREIGN PATENT DOCUMENTS

| | | |
|---|---|---|
| CN | 109920836 A | 6/2019 |
| CN | 110473896 A | 11/2019 |
| CN | 111210726 A | 5/2020 |
| CN | 112054042 A | 12/2020 |
| CN | 112185997 A | 1/2021 |
| CN | 112582452 A | 3/2021 |
| JP | 2009075393 A | 4/2009 |
| JP | 2015026578 A | 2/2015 |
| JP | 2018098134 A | 6/2018 |
| KR | 20190004478 A | 1/2019 |
| KR | 20200008837 A | 1/2020 |

* cited by examiner

DISPLAY SUBSTRATE, METHOD FOR FORMING THE SAME AND DISPLAY DEVICE

CROSS REFERENCE TO RELATED APPLICATION

This application is the U.S. national phase of PCT Application No. PCT/CN2022/087444 filed on Apr. 18, 2022, which is incorporated herein by reference in its entirety.

TECHNICAL FIELD

The present disclosure relates to the field of display technology, in particular to a display substrate, a method for forming the display substrate and a display device.

BACKGROUND

In the related art, a stretchable and flexible display device becomes a trend in the display technology in the future.

Such layers as a base substrate and a circuit layer, especially an inorganic layer, in the display device have a certain bending property, but have a limited amount of stretchability. When the stretching is performed directly, the layers such as the inorganic layer, an organic layer, the base substrate and the circuit layer in the display device are broken or irreversibly deformed. Therefore, in the related art, holes are formed in the base substrate and a film layer on the base substrate, so as to form hollowed-out regions. In this way, a plurality of islands arranged in an array form and spaced apart from each other and a plurality of connection bridges for connecting each of the plurality of islands are formed in the display substrate, so that the display substrate has a stretchable property. A display unit is arranged on the island, and signal lines are arranged on the connection bridges. The quantity of pixels in the display unit, an encapsulation size, a size of each hollowed-out region and the like all affect the display effect. Due to the rational leads wiring structure above the display unit, it is able to effectively improve the quantity of leads, the quantity of pixels and PPI (pixels per inch). In the related art, a short circuit or signal crosstalk easily occurs for the stretchable display substrate.

SUMMARY

In one aspect, the present disclosure provides in some embodiments a display substrate, including: a base substrate including a plurality of islands arranged in an array form and spaced apart from each other and a plurality of connection bridges for connecting each of the plurality of islands, a plurality of display units arranged in an array form, where at least one display unit is arranged on each island, the display unit includes a thin film transistor and a light-emitting element, the light-emitting element includes a first electrode electrically connected to the thin film transistor, a second electrode located at one side of the first electrode away from the base substrate and an electroluminescent layer located between the first electrode and the second electrode, and a connection unit for electrically connecting each of the display units, including a plurality of signal lines arranged on the connection bridges. One or more annular electrodes are further arranged on each island, an orthographic projection of each annular electrode onto the base substrate does not overlap an orthographic projection of the first electrode onto the base substrate, and the plurality of signal lines at least includes one or more first signal lines and one or more second signal lines. The annular electrode includes a first region and a second region, the one or more first signal lines and the second electrode are electrically connected to each other through being in contact with the first region, and the one or more second signal lines are electrically connected to the thin film transistor from one of the connection bridges after passing through the second region. A line width of the annular electrode in the first region is larger than a line width of the annular electrode in the second region, or the second region is a hollowed-out region.

Illustratively, each second signal line is arranged at a same layer and made of a same material as each first signal line.

Illustratively, at least one source/drain metal layer is arranged on the base substrate, and patterns of the at least one source/drain metal layer include patterns of a source electrode and a drain electrode of the thin film transistor, the first signal line and the second signal line.

Illustratively, the first signal line includes a first power voltage signal line, and the second signal line includes at least one of a data signal line and a second power voltage signal line.

Illustratively, the plurality of connection bridges includes one or more first bridges arranged in a first stretching direction and one or more second bridges arranged in a second stretching direction crossing the first stretching direction, at least one of the first signal lines is arranged on the first bridge, and at least one of the second signal lines is arranged on the second bridge.

Illustratively, at least one of the first signal lines is arranged on the second bridge and located at an outer position of the plurality of signal lines.

Illustratively, the first electrode is arranged at a same layer and made of a same material as the annular electrode, and the first electrode and the annular electrode are insulated from each other.

Illustratively, the first electrode is an anode, and the second electrode is a cathode.

Illustratively, at least one of the annular electrodes is arranged corresponding to one of the display units, and the orthographic projection of the at least one of the annular electrodes onto the base substrate is located at a periphery of orthographic projections of first electrodes in the corresponding display unit onto the base substrate.

Illustratively, the orthographic projection of the annular electrode onto the base substrate is of an annular structure surrounding the periphery of the display unit, the annular electrode includes four side edge portions surrounding the periphery of the display unit and four corner portions each connecting two adjacent side edge portions, the first region includes at least one of the side edge portions, and the second region includes at least one of the corner portions. Alternatively, the annular electrode includes at least two side edge portions surrounding the periphery of the display unit, at least two adjacent side edge portions are disconnected from each other to form the hollowed-out region, the first region includes at least one of the side edge portions, and the second region includes the hollowed-out region. Alternatively, the annular electrode includes one side edge portion located at a first side of the display unit, the first region includes the one side edge portion, and the second region includes hollowed-out regions at other sides of the display unit except the first side. Alternatively, the orthographic projection of the annular electrode onto the base substrate is of an annular structure surrounding the periphery of the display unit, the annular electrode includes at least two arc-like portions and at least two corner portions each connecting two adjacent arc-like portions, the first region includes at least one of the arc-like portions, and the second region includes at least one of the corner portions.

Illustratively, the corner portion is an arc-shaped corner and an orthographic projection of the corner portion onto the base substrate is of an arc-like shape.

Illustratively, at least one arc-shaped corner is of a circular arc-like shape protruding toward an outer side of the annular structure, and/or, at least one arc-shaped corner is of a circular arc-like shape protruding toward an inner side of the annular structure.

Illustratively, one of the annular electrodes is arranged corresponding to one of the display units, and the orthographic projection of the one annular electrode onto the base substrate is located in the middle of orthographic projections of first electrodes in the corresponding display unit onto the base substrate, and the one or more first signal lines are located in the middle of the plurality of signal lines.

Illustratively, the plurality of signal lines further includes a plurality of third signal lines located on one side of the one or more first signal lines and the one or more second signal lines close to the base substrate, a line width of the annular electrode in an overlapping region at which an orthographic projection of each third signal line onto the base substrate overlaps the orthographic projection of the annular electrode onto the base substrate is less than or equal to the line width of the annular electrode in the first region, or the overlapping region is a hollowed-out region.

Illustratively, a contact region at which the one or more first signal lines are in contact with the first region has a width of 2 μm to 30 μm in a line width direction of the first signal line.

Illustratively, an orthographic projection of the annular electrode onto the island matches a shape of the island.

Illustratively, an orthographic projection of the second electrode onto the island covers an orthographic projection of the display unit onto the island and at least partially overlaps the orthographic projection of the annular electrode onto the base substrate.

Illustratively, an overlapping region at which an orthographic projection of the second electrode onto the base substrate overlaps the orthographic projection of the annular electrode onto the base substrate is at least located on two opposite sides of the annular electrode.

Illustratively, the display substrate is a stretchable display substrate.

In another aspect, the present disclosure further provides in some embodiments a display device including the above-mentioned display substrate.

In yet another aspect, the present disclosure further provides in some embodiments a method for forming the above-mentioned display substrate, including: providing the base substrate including the plurality of islands arranged in an array form and spaced apart from each other and the plurality of connection bridges for connecting each of the plurality of islands, forming the plurality of display units, the connection unit electrically connecting each of the display units and the annular electrode arranged on each island on the base substrate. At least one display unit is arranged on each island, the display unit includes a thin film transistor and a light-emitting element, the light-emitting element includes a first electrode electrically connected to the thin film transistor, a second electrode located at one side of the first electrode away from the base substrate, and an electroluminescent layer located between the first electrode and the second electrode. The connection unit includes the plurality of signal lines arranged on the connection bridges, the orthographic projection of the annular electrode onto the base substrate does not overlap the orthographic projection of the first electrode onto the base substrate, and the plurality of signal lines at least includes one or more first signal lines and one or more second signal lines. The annular electrode includes a first region and a second region, and the one or more first signal lines and the second electrode are electrically connected to each other through being in contact with the first region, the one or more second signal lines are electrically connected to the thin film transistor from one of the connection bridges after passing through the second region. The line width of the annular electrode in the first region is larger than the line width of the annular electrode in the second region, or the second region is a hollowed-out region.

Illustratively, each first signal line and each second signal line are formed through a same patterning process, the first electrode and the annular electrode are formed through a same patterning process.

Figure 1:
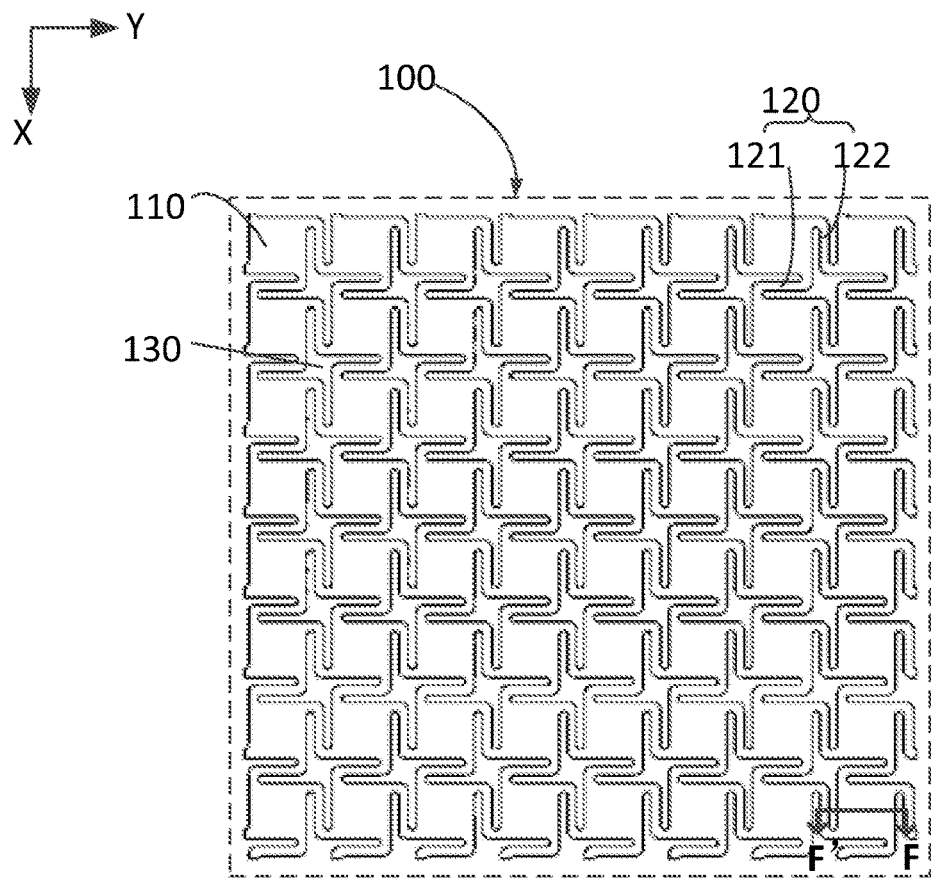
FIG. 1 is a front view of a display substrate according to some embodiments of the present disclosure.

Reference signs of components in the drawings are as follows.

Base substrate 100, island 110, connection bridge 120, hollowed-out region 130, first bridge 121, second bridge 122, display unit 200, thin film transistor 210, source electrode 211, drain electrode 212, active layer 213, gate electrode 214, light-emitting element 220, first electrode 221, second electrode 222, electroluminescent layer 223, annular electrode 230, side edge portion 231, arc-like portion 233, first signal line 251, first wire 251a, second wire 251b, second signal line 252, first region S1, second region S2, pixel definition layer 260, encapsulation layer 270, buffer layer 310, first gate insulation layer 320, second gate insulation layer 330, third insulation layer 340.

DETAILED DESCRIPTION

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before the detailed description on the embodiments of the present disclosure, it is necessary to describe the related art as follows.

In the related art, holes are formed in a base substrate and a film layer on the base substrate in a display substrate, so as to form hollowed-out regions. In this way, a plurality of islands arranged in an array form and spaced apart from each other and a plurality of connection bridges connecting each of the plurality of islands are formed in the display substrate, so that the display substrate has a stretchable property. A display unit is arranged on the island, and signal lines may be arranged on the connection bridges. A thin film transistor, an organic light-emitting element, an encapsulation structure and the like may be arranged in the display unit. The quantity of pixels in the display unit, an encapsulation size, a size of each hollowed-out region and the like all affect the display effect. Due to the rational leads wiring structure above the display unit, it is able to effectively improve the quantity of leads, the quantity of pixels, and PPI (pixels per inch).

In the related art, a short circuit or signal crosstalk easily occurs for the display substrate. It has been found through study that one of the reasons why the short circuit or signal crosstalk easily occurs is as follows.

Generally, the organic light-emitting element in the display unit includes an anode, a cathode, and an organic light-emitting layer between the anode and the cathode. A cathode ring surrounding a periphery of the display unit is further arranged on the island, and the cathode ring is of a closed ring shape and grounded. The cathode covers the display unit region and is in contact with the cathode ring. A first power voltage signal line is configured to provide a driving power voltage signal for the cathode, and is arranged on the connection bridge, and the cathode ring is in contact with the first power voltage signal line (a VSS signal line), so as to enable the first power voltage signal line to be electrically connected to the cathode. In this regard, since the signal lines arranged on the connection bridges need to enter the island first, and then are electrically connected to the display unit, in addition to the first power voltage signal line, other signal lines also extend to the display unit after passing through the cathode ring, and orthographic projections of other signal lines onto the base substrate overlap an orthographic projection of the cathode ring onto the base substrate at an overlapping position where short circuit or signal crosstalk between the cathode ring and the signal lines occurs easily.

In order to address the above-mentioned issues, the present disclosure provides in the embodiments a display substrate, a method for forming the display substrate and a display device, so as to mitigate the short circuit or signal crosstalk defect.

As shown in FIG. 1 to FIG. 4, the display substrate includes a base substrate 100, a plurality of display units 200, and a connection unit. The base substrate 100 includes a plurality of islands 110 arranged in an array form and spaced apart from each other, and a plurality of connection bridges 120 for connecting each of the plurality of islands 110. The plurality of display units 200 are arranged in an array form, at least one display unit 200 is arranged on each island 110, the display unit 200 includes a thin film transistor 210 and a light-emitting element 220, and the light-emitting element 220 includes a first electrode 221 electrically connected to the thin film transistor 210, a second electrode 222 located at one side of the first electrode 221 away from the base substrate 100 and an electroluminescent layer 223 located between the first electrode 221 and the second electrode 222. The connection unit is used to electrically connect each of the display units 200, and includes a plurality of signal lines arranged on the connection bridges 120.

One or more annular electrodes 230 are further arranged on each island 110, an orthographic projection of each annular electrode 230 onto the base substrate does not overlap an orthographic projection of the first electrode 221 onto the base substrate 100, and the plurality of signal lines at least includes one or more first signal lines 251 and one or more second signal lines 252. The annular electrode 230 includes a first region S1 and a second region S2, the one or more first signal lines 251 and the second electrode 222 are electrically connected to each other through being in contact with the first region S1, i.e., the first region S1 is a region where the electrode ring 230 is in contact with the second electrode 222 and the one or more first signal lines 251.

Orthographic projections of the one or more second signal lines 252 onto the base substrate 100 are electrically connected to the thin film transistor 210 from one of the connection bridges 120 after passing through the second region S2, i.e., the second region S2 is a region at which the orthographic projection of the second signal line 252 onto the base substrate 100 overlaps the orthographic projection of the annular electrode 230 onto the base substrate 100. A line width of the annular electrode 230 in the first region S1 is larger than a line width of the annular electrode in the second region S2, or the second region S2 is a hollowed-out region.

It should be appreciated that, the line width of the annular electrode 230 in the first region S1 is larger than the line width of the annular electrode 230 in the second region S2, it means that the line width of the annular electrode 230 in the second region S2 is reduced.

The second region S2 is a hollowed-out region, it means that the annular electrode 230 is processed in any manner of removing the material of the annular electrode such as being directly patterned at the second region S2 to form a gap, a blank region and the like.

In the above solution, the annular electrode 230 is in contact with the second electrode 222 in the display substrate, and the first signal line 251 of the connection unit is in contact with the annular electrode 230, so as to enable the first signal line 251 to be electrically connected to the second electrode 222. In order to avoid a short circuit or signal crosstalk defect between the second signal line 252 of the connection unit which does not need to be in contact with the annular electrode 230 and the annular electrode 230, the annular electrode 230 at a position (i.e., the second region S2) where the second signal line 252 enters the display unit 200 from the bridge has a smaller line width or is removed, i.e., the line width of the annular electrode in the second region S2 is designed to be smaller than the line width of the annular electrode in the first region, or the second region S2 is designed as the hollowed-out region, thereby to mitigate the short circuit or signal crosstalk defect between the second signal line 252 and the annular electrode 230 and increase the wiring space of the signal lines.

In some illustrative embodiments of the present disclosure, each second signal line 252 is arranged at a same layer and made of a same material as each first signal line 251. In this regard, since the second signal line 252 is arranged at the same layer and made of the same material as the first signal line 251, a short circuit or signal crosstalk occurs more easily between the second signal line 252 and the electrode ring 230. Therefore, in the embodiment of the present disclosure, the annular electrode 230 at an overlapping region where an orthographic projection of the signal line arranged at the same layer as the first signal line 251 onto the base substrate overlaps the orthographic projection of the annular electrode onto the base substrate has a smaller line width or is removed, so as to avoid the short circuit or signal crosstalk defect.

Figure 2:
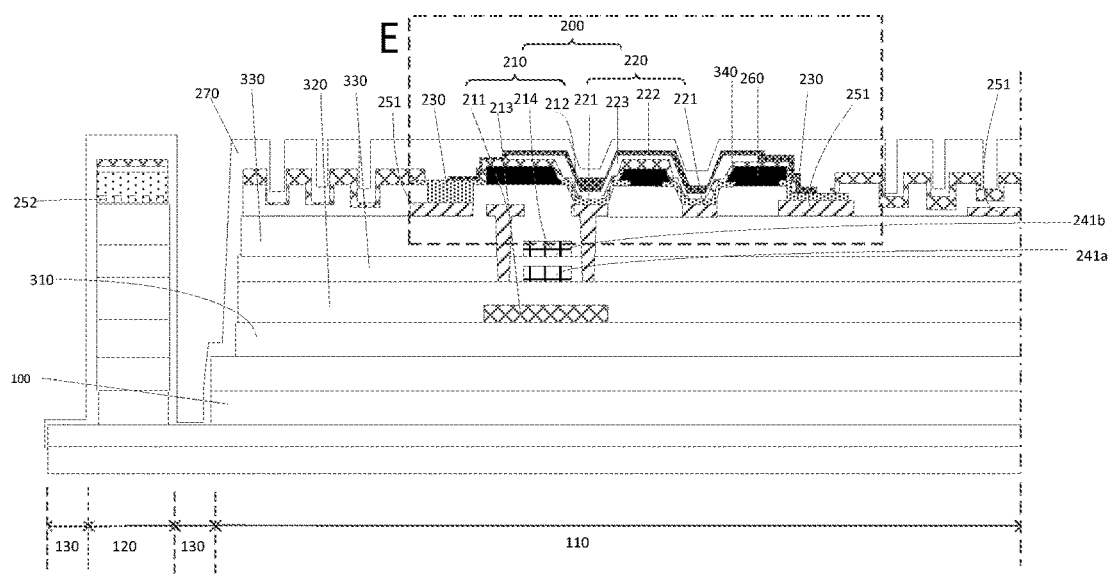
FIG. 2 is a sectional view of the display substrate in FIG. 1 along line F-F.

In some illustrative embodiments of the present disclosure, as shown in FIG. 2, at least one source/drain metal layer is arranged on the base substrate 100, and patterns of the at least one source/drain metal layer include patterns of a source electrode 211 and a drain electrode 212 of the thin film transistor 210, the first signal line 251 and the second signal line 252. In the embodiment of the present disclosure, the first signal line 251 and the second signal line 252 may be simultaneously formed through a same patterning process as the source electrode 211 and the drain electrode 212 of the thin film transistor 210. It should be appreciated that, in practical applications, the first signal line 251 and the second signal line 252 may be formed through patterning a metal layer different from the metal layer for forming the source electrode 211 and the drain electrode 212 of the thin film transistor 210.

It should be appreciated that, the display substrate in FIG. 2 is of a single-layer thin film transistor design, i.e., there may be only one source/drain metal layer, and the first signal line 251 and the second signal line 252 may be arranged at the same layer and made of the same material as the source electrode 211 and the drain electrode 212 of the thin film transistor. In some other embodiments not shown in figures, the display substrate may also be of a two-layer thin film transistor design, i.e., there may be at least two source/drain metal layers, and the first signal line 251 and the second signal line 252 may be located on any one of the source/drain metal layers. Preferably, since the first signal line 251 needs to be in contact with the second electrode 222, the first signal line 251 may be formed through patterning the source/drain metal layer located at a side closest to the second electrode 222.

In the display substrate, the plurality of connection bridges 120 includes one or more first bridges 121 arranged in a first stretching direction X and one or more second bridges 122 arranged in a second stretching direction Y crossing the first stretching direction X.

In some illustrative embodiments of the present disclosure, the plurality of signal wires connecting each display unit 200 includes: signal lines such as a rest line, a GOA (gate driver on array) scanning line or a EOA (emission driver on array) scanning line, an initial voltage line Vinit, a first power voltage signal line (VSS), a second power voltage signal line (VDD) and a data signal line (Data). The first power voltage signal line may be used to provide a driving power voltage signal to the cathode and the second power voltage signal line may be used to provide a driving power voltage signal to the anode. The GOA scanning line or the EOA scanning line crosses the data signal line for connecting the source electrode and the drain electrode of the thin film transistor to control the thin film transistor to be turned on or off. Specifically, the quantity of the signal lines is related to the quantity of sub-pixels in the display unit 200.

In some illustrative embodiments of the present disclosure, the first power voltage signal line, the data signal line and the second power voltage signal line may be formed through patterning the source/drain metal layer, the first signal line 251 may include the first power voltage signal line, and the second signal line 252 may include at least one of the data signal line and the second power voltage signal line. In the embodiment of the present disclosure, the first electrode 221 may be an anode and the second electrode 222 may be a cathode.

It should be appreciated that the above is for illustrative purpose only, in some other embodiments not shown in figures, the first signal line 251 may not be limited to the first power voltage signal line, and the second signal line 252 may not be limited to the data signal line, the second power voltage signal line and the like.

Figure 4:
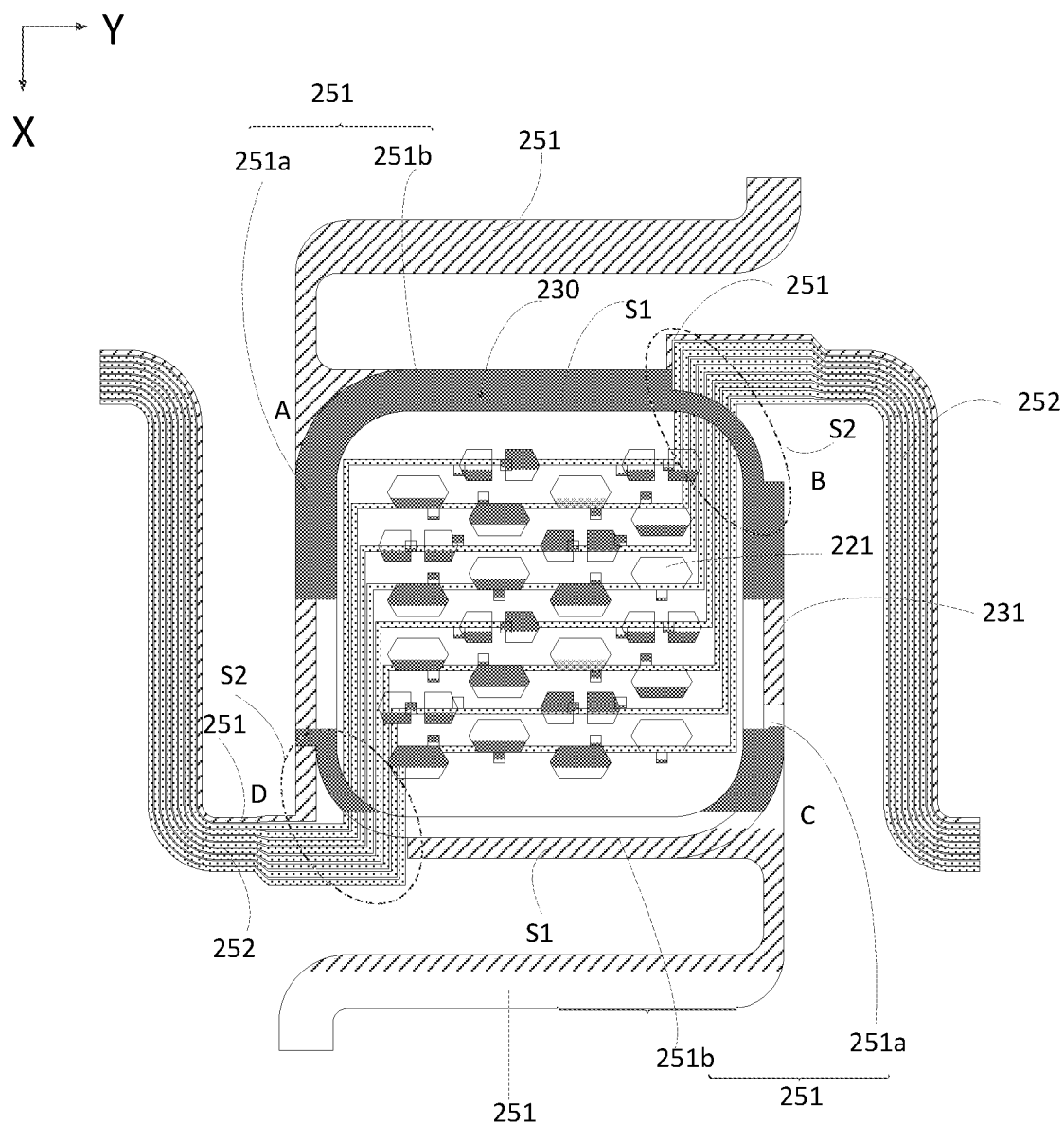
FIG. 4 is a front view of the display substrate where a first electrode, an annular electrode, a first signal line and a second signal line are shown, and a base substrate and a second electrode are not shown.

Furthermore, in some illustrative embodiments of the present disclosure, as shown in FIG. 1, the plurality of connection bridges 120 includes one or more first bridges 121 arranged in a first stretching direction X and one or more second bridges 122 arranged in a second stretching direction Y crossing the first stretching direction X. As shown in FIG. 4, at least one of the first signal lines 251 may be arranged on the first bridge 121 and at least one of the second signal lines 252 may be arranged on the second bridge 122.

In some embodiments of the present disclosure, at least one of the first signal lines 251 and at least one of the second signal lines 252 may be further arranged on the connection bridge 120 in a same stretching direction. For example, at least one of the second signal lines 252 may be arranged on the second bridge 122, at least one of the first signal lines 251 may be arranged on the second bridge 122, and the at least one of the first signal lines 251 is arranged at an outer position of the plurality of signal lines.

It should be appreciated that, referring to FIG. 1 and FIG. 4, in a specific illustrative embodiment of the present disclosure, at least one first signal line 251 is arranged on the first bridge 121 in the first stretching direction X, at least one first signal line 251 and a plurality of second signal lines 252 are arranged on the second bridge 122, i.e., first signal lines 251 are arranged on both the first bridge 121 and the second bridge 122, and the first signal lines 251 on the first bridge 121 and the second bridge 122 are correspondingly electrically connected to each other. That is because, the first signal line 251 needs to be in contact with the second electrode 222, in a case where the first signal line 251 is electrically disconnected from the second electrode 222 in a certain stretching direction, the normal operation of a test stage or a display stage is adversely affected. As a result, the first signal lines 251 may be arranged in both stretching directions. It should be appreciated that the first signal lines 251 may be arranged in only one stretching direction, or may be rationally designed according to actual requirements of the product.

For example, as shown in FIG. 4, the first bridge 121 is connected to the island 110 at two connection positions, i.e., a first position and a second position (corresponding to positions A and C in FIG. 4), and the second bridge 122 is connected to the island 110 at two connection positions, i.e., a third position and a fourth position (corresponding to positions B and D in FIG. 4). The second signal line 252 enters the island 110 through the third position B and the fourth position D. At least one first signal line 251 is arranged on the first bridge 121, enters the island 110 through the first position A and the second position C and is in contact with the annular electrode 230, and at least one first signal line 251 enters the island 110 through the third position B and the fourth position D. The first signal line 251 entering the island 110 through the first position A is in contact, or integrated, with the first signal line 251 entering the island 110 through the third position B and the fourth position D, and the first signal line 251 entering the island 110 through the second position (position C in FIG. 4) may be not connected to the first signal line 251 arranged on the second bridge 122. However, the first signal line 251 at the position C is essentially electrically connected to the first signal line 251 on the second bridge 122 and the first signal line 251 at the position A through the annular electrode 230. For example, a case where one of the islands and the connection bridges connected to the island form a repetition unit is taken as an example, the first signal line at the position C of the island in any one repetition unit (a first repetition unit) is electrically connected to the first signal line at the position A of the island in another adjacent repetition unit (a second repetition unit), and the first signal line at the position A of the island in the another adjacent repetition unit (the second repetition unit) is electrically connected to the first signal lines at the position B and the position D of the island in the repetition unit (the second repetition unit). In this way, it is able to perform wiring design in accordance with a wiring space required by the plurality of signal lines. The above merely provides one manner where the first signal lines 251 in two different stretching directions are electrically connected to each other. However, the present disclosure is not limited thereto, and rational arrangement may be performed in accordance with a wiring space required by an actual product in practical applications. It should be appreciated that, as shown in FIG. 4, when the first signal line 251 on the first bridge 121 and the first signal line 251 on the second bridge 122 are electrically connected to each other, the first signal line 251 on the second bridge 122 may be disposed at an outermost side of the plurality of second signal lines 252 on the second bridge 122, so as to be electrically connected to the first signal line 251 on the first bridge 121 in a better manner.

Figure 3:
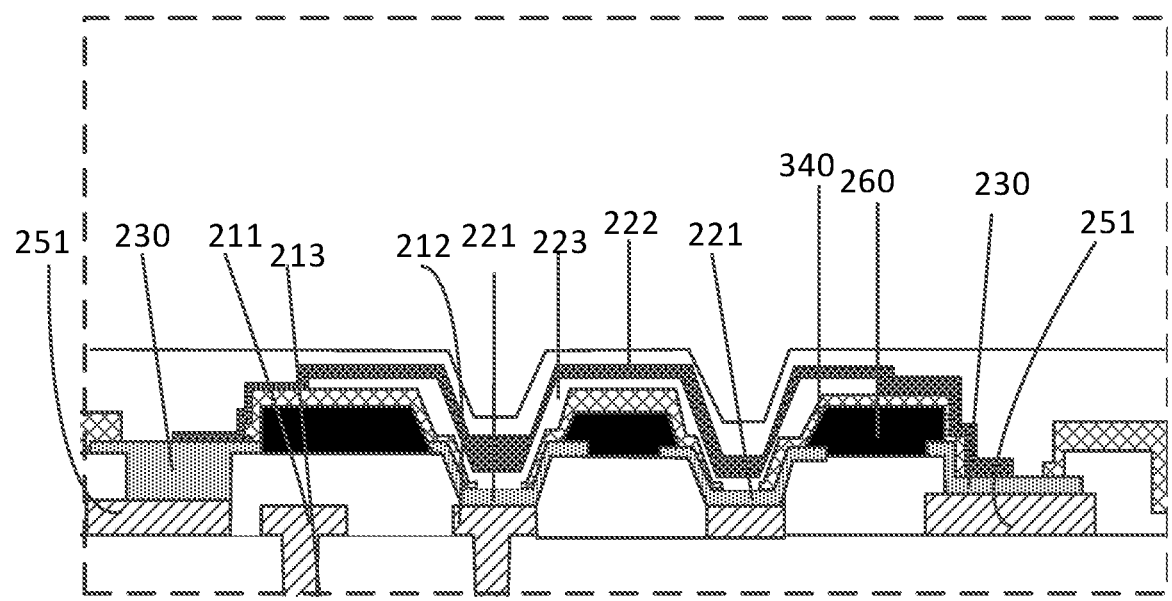
FIG. 3 is a partially enlarged view of the dashed box E in FIG. 2.
Figure 5:
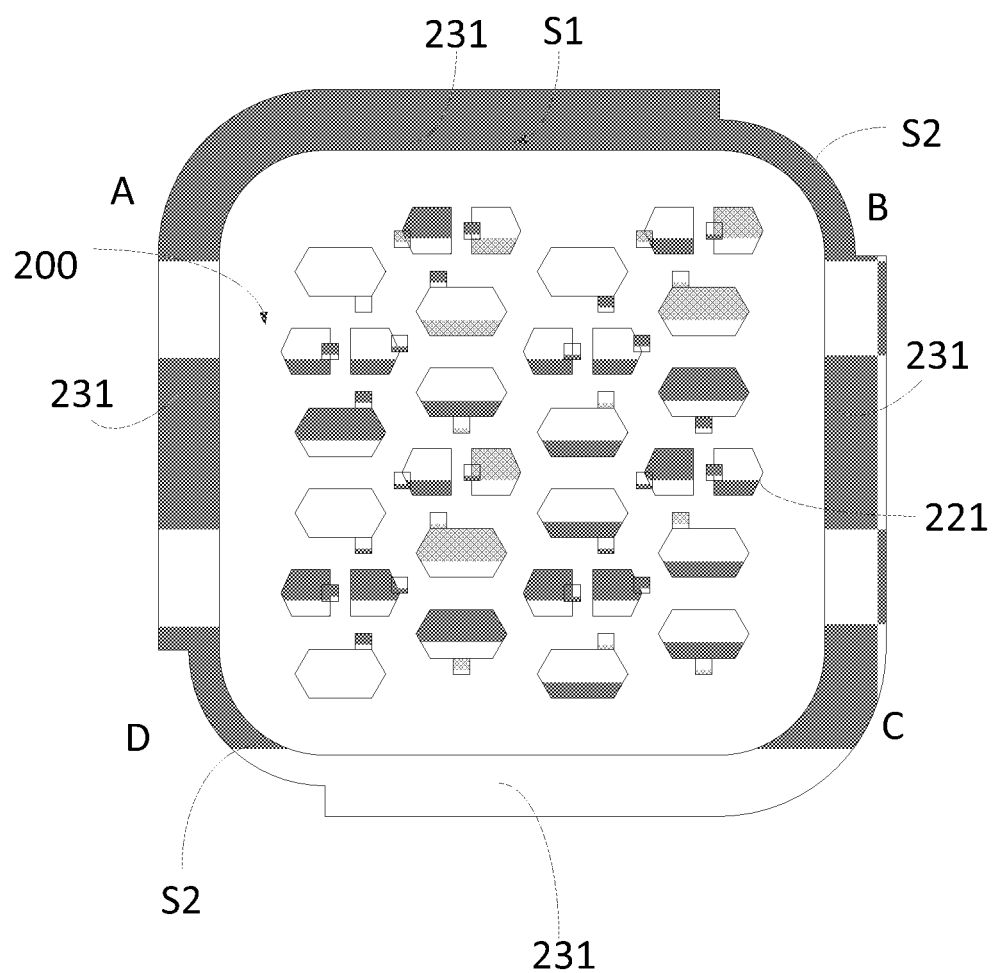
FIG. 5 is a schematic view showing the annular electrode and the first electrode in FIG. 4.

In addition, as shown in FIG. 2, FIG. 3 and FIG. 5, the first electrode 221 is arranged at a same layer and made of a same material as the annular electrode 230, and the first electrode 221 and the annular electrode 230 are insulated from each other. Thus, the first electrode 221 and the electrode ring 230 may be formed through a same patterning process, so as to simplify the process. For example, taking a Low Temperature Poly-Silicon LTPS display substrate as an example, the first electrode 221 is an anode, and the first electrode 221 is arranged at a same layer and made of a same material as the annular electrode 230. Specifically, an ITO/Ag/ITO film layer may be selected to form patterns of the first electrode 221 and the annular electrode 230 through patterning. The annular electrode 230 is an annular cathode which is in contact with the first power voltage signal line and the first electrode 221 is an anode which is in contact with the data signal line.

It should be appreciated that, in practical applications, the annular electrode 230 may be arranged at a different layer and/or made of a different material from the first electrode 221.

FIG. 2 is a sectional view of the display substrate according to some embodiments of the present disclosure. FIG. 3 is an enlarged view of the dashed box E in FIG. 2. As shown in FIG. 2 and FIG. 3, a structure of the display substrate is as follows.

The display substrate includes a base substrate 100 including a plurality of islands 110 arranged in an array form and spaced apart from each other, a plurality of connection bridges 120 for connecting each of the plurality of islands 110 and a plurality of hollowed-out regions 130 for separating the plurality of islands 110, and a display unit 200 located on each island 110. The display unit 200 includes a thin film transistor 210 and a light-emitting element 220 located on the base substrate 100, the thin film transistor 210 includes an active layer 213, a gate electrode 214 (in the figures, the gate electrode 214 may include a first gate electrode 214a and a second gate electrode 214b), a source electrode 211 and a drain electrode 212. A pixel definition layer (PDL) 260 is formed on a side of the thin film transistor 210 away from the base substrate 100, and a plurality of pixels is defined by the pixel definition layer 260. The light-emitting element 220 is located on one side of the thin film transistor 210 away from the base substrate 100, and includes a first electrode 221 in contact with the source electrode 211, an electroluminescent layer 223 located on the first electrode 221 and a second electrode 222 located on the electroluminescent layer 223. A first signal line 251 and a second signal line 252 are arranged at a same layer as the source electrode 211 and drain electrode 212, the first signal line 251 is in contact with the annular electrode 230 that is arranged at a same layer and made of a same material as the first electrode 221, and the second signal line 252 is in contact with the first electrode 221. The display unit 200 is encapsulated by an encapsulation layer 270.

Furthermore, as shown in FIG. 2 and FIG. 3, in addition to the above structural film layers, the display substrate further includes such film layers as insulation layers and planarization layers each located between two adjacent conductive film layers, e.g., a buffer layer 310, a first gate insulation layer 320, a second gate insulation layer 330 and a third insulation layer 340 in FIG. 2 and FIG. 3.

It should be appreciated that the above is for illustrative purpose only, and the present disclosure is not limited thereto.

In addition, at least one of the annular electrodes 230 is arranged corresponding to one of the display units 200, and the quantity of annular electrodes 230 and an area (a line width and a length) of the annular electrode 230 mainly depend on the quantity of pixels in the corresponding display unit 200. When the quantity of pixels in the display unit 200 is large, a required current is large, and the quantity of annular electrodes 230 and an overlapping area of the annular electrode need to be increased, so as to avoid current overload. When the quantity of pixels in the display unit 200 is small, a position of the annular electrode, the quantity of annular electrodes and the overlapping area of the electrode ring 230 are slightly affected, and there does not exist a voltage drop issue.

A detailed description about the display substrate will be given below with reference to some illustrative embodiments of the present disclosure.

As shown in FIG. 3 to FIG. 12, the orthographic projection of at least one annular electrode ring 230 onto the base substrate 100 is located at a periphery of orthographic projections of first electrodes 221 in the corresponding display unit 200 onto the base substrate 100.

In the embodiment of the present disclosure, at least one first signal line 251 may be located at the outer position of the plurality of signal lines. It should be appreciated that the outer position means that, as shown in FIG. 4, the first signal line 251 and the second signal line 252 arranged at the same layer as the first signal line 251 may be arranged on the connection bridge 120 in different stretching directions, or, the first signal line 251 and the second signal line 252 may be arranged on the same connection bridge 120 in the same stretching direction, and the first signal line 251 may be located on the outermost side of the plurality of second signal lines 252.

As shown in FIG. 4 to FIG. 6 and FIG. 10, the annular electrode 230 may be of an annular structure surrounding the periphery of the display unit 200. The annular electrode 230 may be of an closed annular structure that approximates a rectangle and include four side portions 231 surrounding the periphery of the display unit 200 and four corner portions each connecting two adjacent side edge portions 231, the first region S1 includes at least one of the side edges portions 231 and the second region S2 includes at least one of the corner portions. Specifically, as shown in FIG. 4 to FIG. 6 and FIG. 10, the annular electrode 230 has the closed annular structure that approximates a rectangle, and four side edge portions 231 thereof may each be a straight edge. Taking four corner portions A, B, C and D of the annular electrode 230 as an example, the second signal lines 252 enter the display unit 200 through two opposite corner portions B and D of the annular electrode 230, and the two opposite corner portions B and D are overlapping regions with the second signal line 252. Correspondingly, the two opposite corner portions B and D of the annular electrode 230 form the second region S2, the four side edge portions 231 and the other two opposite corner portions A and C form the first region S1, and the line width of the annular electrode 230 in the second region S2 is designed to be less than the line width of the annular electrode 230 in the first region S1, so as to avoid a short circuit or signal crosstalk defect between the second signal line 252 and the annular electrode 230.

It should be appreciated that, as shown in FIG. 4, the first signal line 251 may be in contact with the annular electrode 230 in the following manner.

A case where at least one first signal line 251 is arranged in a different stretching direction from the second signal lines 252 is taken as an example, the at least one first signal line 251 is arranged in the second stretching direction Y, and the second signal line 252 is arranged in the first stretching direction X. At the corner portion A among four corner portions A, B, C and D of the annular electrode 230, the first signal line 251 arranged in the second stretching direction Y is in contact with the annular electrode 230, and the first signal line 251 has a wiring shape of two divergent wires, i.e., a first wire 251*a* and a second wire 251*b* in FIG. 4 respectively in contact with two side edge portions 231 at the corner portion A. Similarly, at the corner portion C, the first signal line 251 arranged in the second stretching direction Y is in contact with the annular electrode 230, and the first signal line 251 has a wiring shape of two divergent wires, i.e., a first wire 251*a* and a second wire 251*b* in FIG. 4, respectively in contact with two side edge portions 231 at the corner portion C.

In some embodiments of the present disclosure, the corner portion is not of a right-angle shape, but is an arc-shaped corner of which an orthographic projection onto the base substrate is of an arc-like shape. In the exemplary embodiment of the present disclosure, a connection position at which the connection bridge 120 is electrically connected to the island 110 corresponds to the corner portion of the annular electrode 230, and due to a large force applied to the connection position between the connection bridge 120 and the island 110 during tension, in a case where the corner portion is of the right-angle shape, the right angle may protrude toward the connection position between the connection bridge 120 and the island 110, a defect may occur easily. In a case where the corner portion is designed as the arc-shaped corner, it is able to be farther away from the connection position between the connection bridge 120 and the island 110 as compared with the case of the right-angle shape, thereby reducing the occurrence of the defect.

In some embodiments of the present disclosure, as shown in FIG. 4, at least one arc-shaped corner is of a circular arc-like shape protruding toward an outer side of the annular structure. In some embodiments not shown in figures, at least one arc-shaped corner may be a circular arc-like shape protruding toward an inner side of the annular structure.

Figure 12:
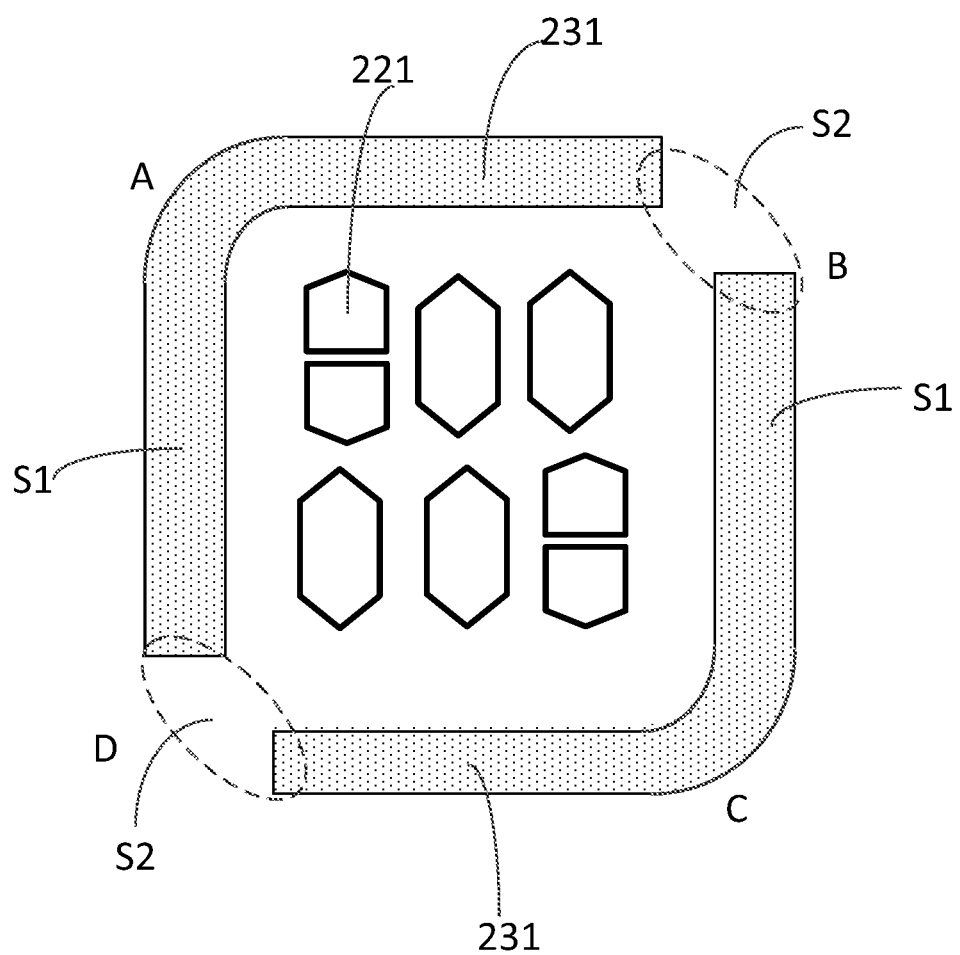
FIG. 12 is still yet another schematic view showing the annular electrode in the display substrate according to some embodiments of the present disclosure.
Figure 13:
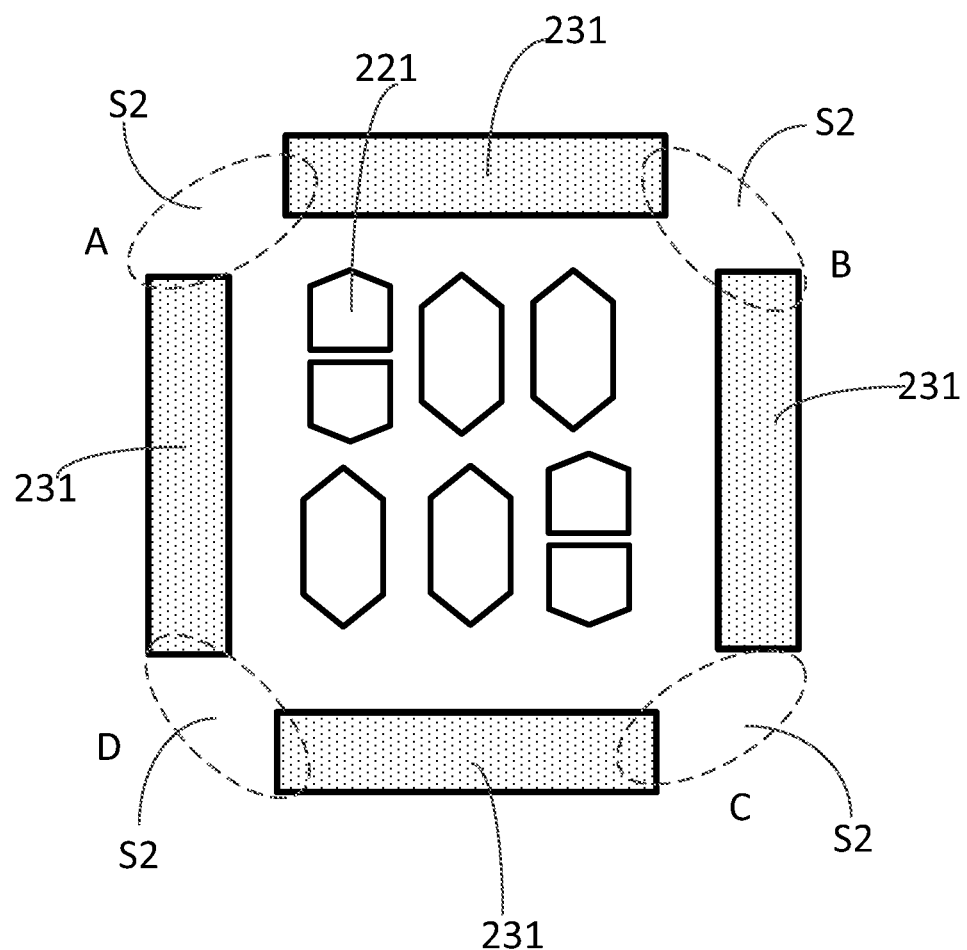
FIG. 13 is still yet another schematic view showing the annular electrode in the display substrate according to some embodiments of the present disclosure.

It should be appreciated that the shape of the corner portion is designed to be as far away from the connection position between the connection bridge 120 and the island 110 as possible while meeting the requirement on the overlapping area of the annular electrode 230, and is not particularly defined herein. For example, the corner portion may be further an oblique edge connecting the two adjacent side edge portions 231. In some other embodiments of the present disclosure, as shown in FIG. 12 to FIG. 13, the annular electrode 230 may be of a non-closed annular structure surrounding the periphery of the display unit 200. The annular electrode 230 includes at least two side edge portions 231 surrounding the periphery of the display unit 200, at least two adjacent side edge portions 231 are disconnected from each other to form the hollowed-out region, the first region S1 includes at least one of the side edge portions 231, and the second region S2 includes the hollowed-out region.

Specifically, FIG. 13 shows that the annular electrode 230 includes four side edge portions 231 surrounding at the peripheral side of the display unit 200 and every two adjacent side edge portions 231 are disconnected from each other to form the hollowed-out region. FIG. 12 shows that the annular electrode 230 includes four side edge portions 231 surrounding at the peripheral side of the display unit 200, only the side edge portions 231 at the corner portions B and D where the electrode ring 230 overlaps the second signal line 252 are disconnected from each other, and the adjacent side edge portions 231 at the other two corners A and C are not disconnected from each other.

Figure 14:
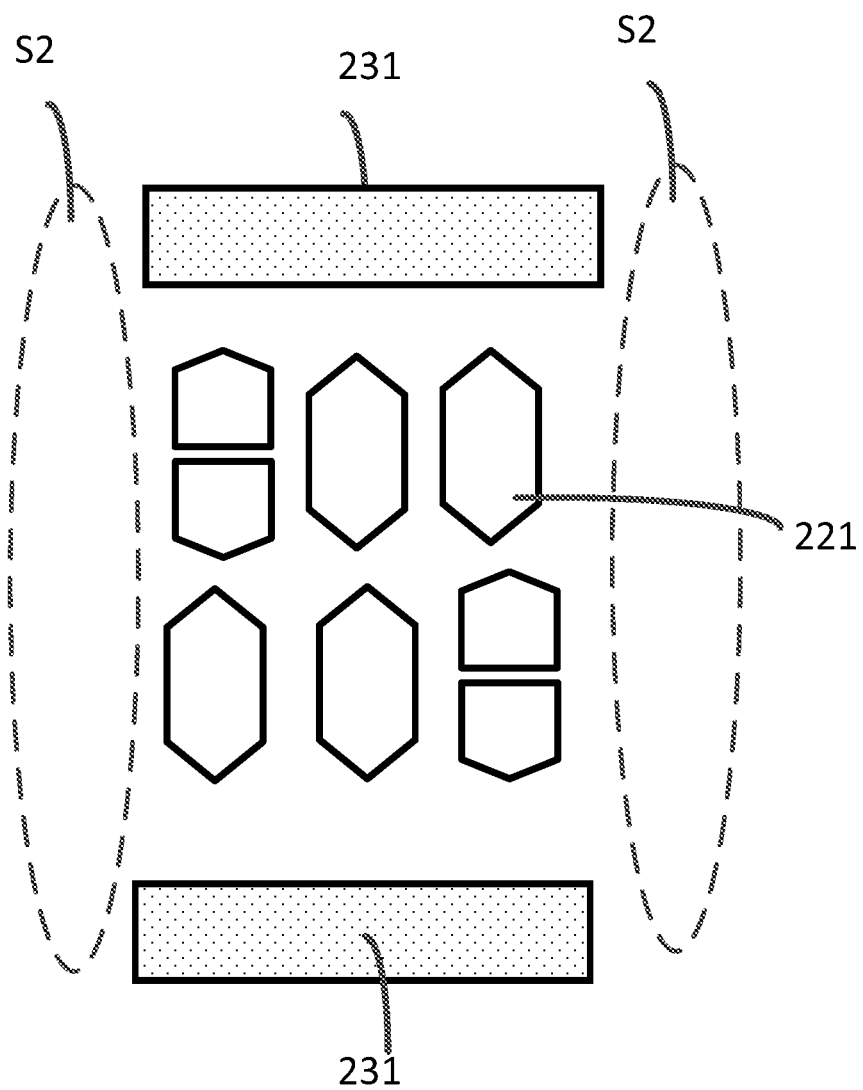
FIG. 14 is a still yet another schematic view showing the annular electrode in the display substrate according to some embodiments of the present disclosure.

In some other embodiments of the present disclosure, as shown in FIG. 14, the annular electrode 230 includes two side edge portions 231 on opposite sides of the display unit 200, the first region S1 includes the two side edge portions 231, and the second region S2 includes the hollowed-out region formed through the two side edge portions 231 being disconnected from each other.

Figure 15:
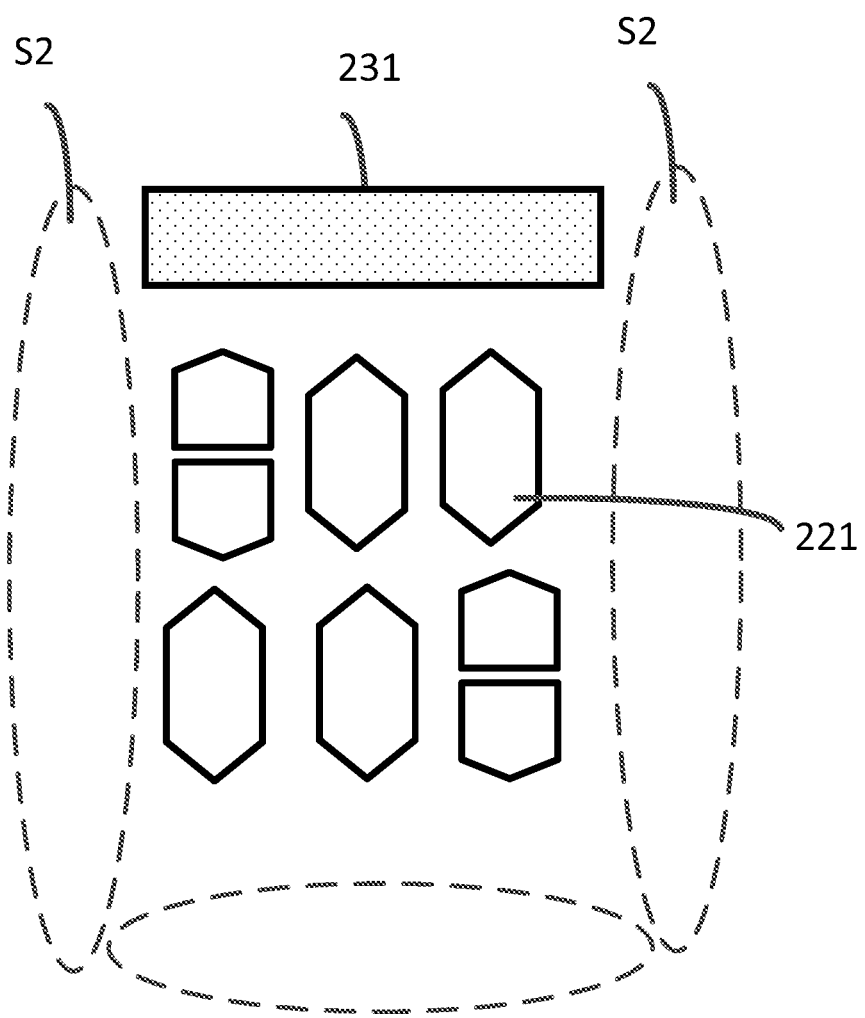
FIG. 15 is a still yet another schematic view showing the annular electrode in the display substrate according to some embodiments of the present disclosure.

In some other embodiments of the present disclosure, as shown in FIG. 15, the annular electrode 230 includes one side edge portion 231 at a first side of the display unit 200, the first region S1 includes the one side edge portion 231, and the second region S2 includes hollowed-out regions at other sides of the display unit 200 except the first side.

Figure 7:
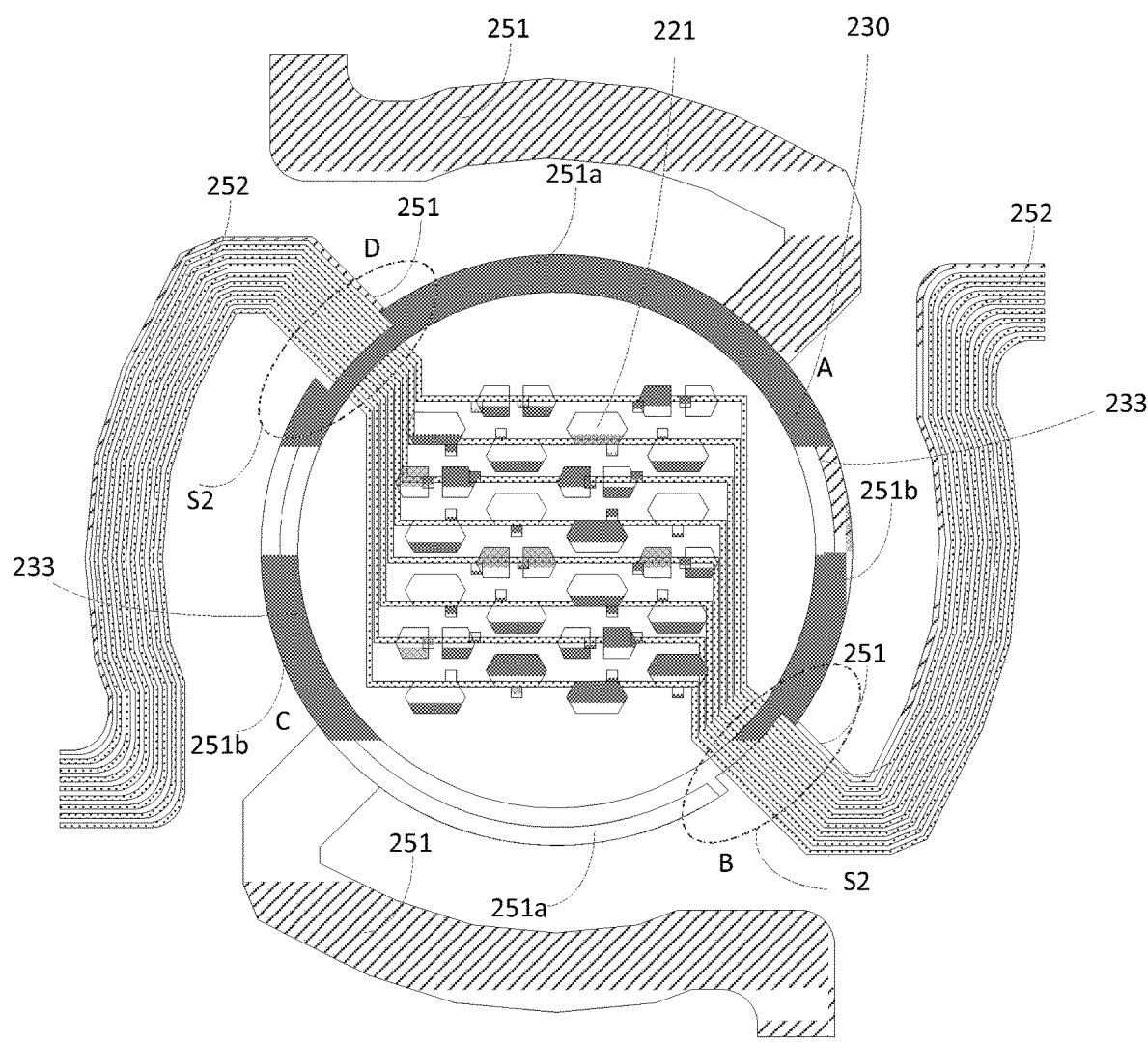
FIG. 7 is yet another front view of the display substrate where the first electrode, the annular electrode, the first signal line and the second signal line are shown, and the base substrate and the second electrode are not shown.
Figure 8:
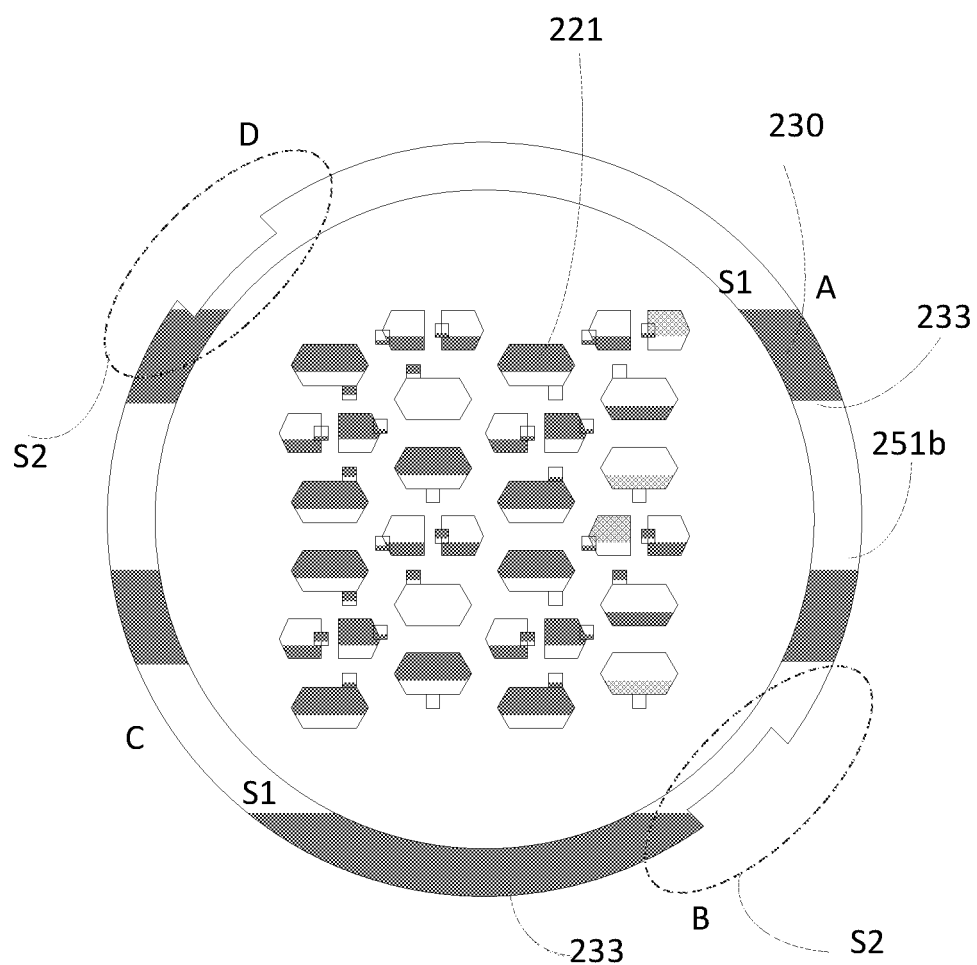
FIG. 8 is a schematic view showing the annular electrode and the first electrode in FIG. 7.
Figure 9:
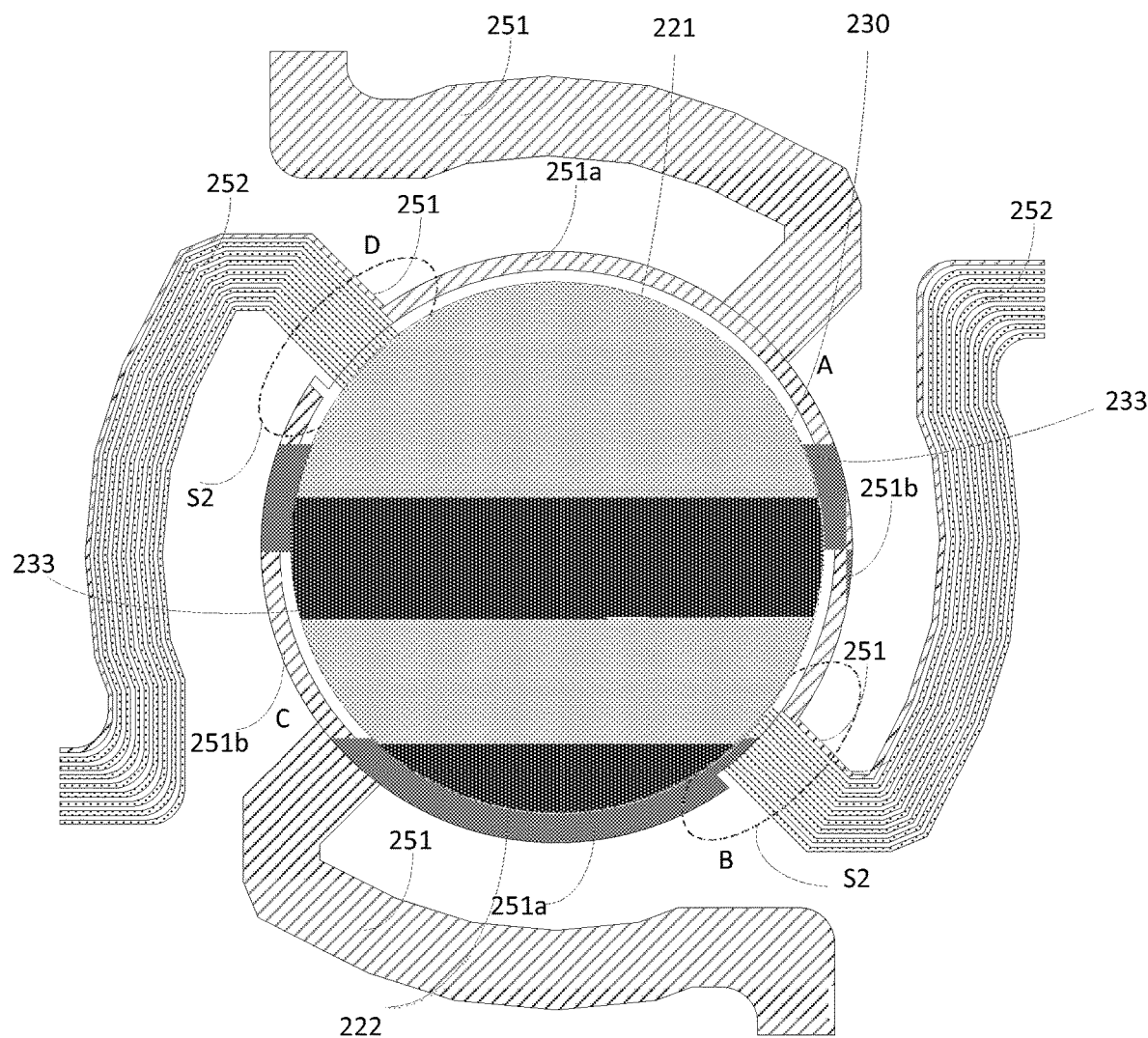
FIG. 9 is still yet another front view of the display substrate where the first electrode, the annular electrode, the first signal line, the second signal line and the second electrode are shown.

It should be appreciated that, a case where the annular electrode 230 has a rectangular ring shape (or includes a straight side edge portion 231) is taken as an example when the above exemplary embodiments are illustrated. In some other embodiments of the present disclosure, the shape of the annular electrode 230 is not limited thereto. For example, the orthographic projection of the annular electrode 230 onto the base substrate 100 is of an annular structure surrounding the periphery of the display unit 200, and the annular electrode 230 has a circular or elliptical closed annular shape, or a circular or elliptical non-closed annular shape. As shown in FIG. 7 to FIG. 9, the annular electrode 230 includes at least two arc-like portions 233 and at least two corner portions each connecting two adjacent arc-like portions 233, the first region S1 includes at least one of the arc portions 233, and the second region S2 includes at least one of the corner portions.

It should be further appreciated that, in the above embodiments, only the annular electrode 230 at the overlapping region between the annular electrode 230 and the second signal line 252 has a smaller line width or is removed, in some other embodiments of the present disclosure, the plurality of signal lines further includes a plurality of third signal lines located at one side of the first signal line 251 and the second signal line 252 close the base substrate 100, and a line width of the annular electrode in an overlapping region at which an orthographic projection of each third signal line onto the base substrate overlaps the orthographic projection of the annular electrode 230 onto the base substrate 100 is less than or equal to the line width of the annular electrode in the first region S1, or the overlapping region is a hollowed-out region.

Figure 10:
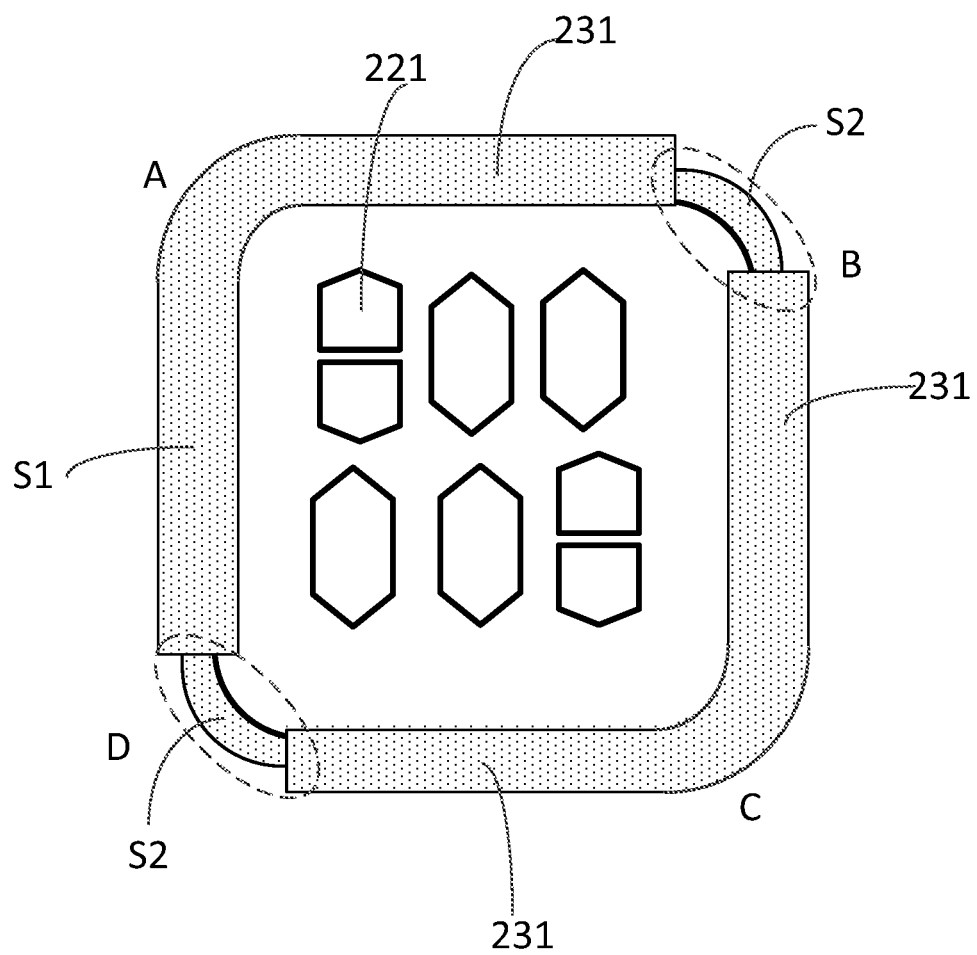
FIG. 10 is another schematic view showing the annular electrode in the display substrate according to some embodiments of the present disclosure.

In the above solution, since the third signal line is arranged at a different layer from the first signal line 251 and located on the side of the first signal line 251 away from the annular electrode 230, a short circuit or signal crosstalk between the annular electrode 230 and the third signal line is relatively unlikely to occur, and the line width of the annular electrode in the overlapping region between the third signal line and the annular electrode 230 may be not reduced. As shown in FIG. 10, only the line width of the annular electrode 230 at two opposite corner portions B and D at which the orthographic projection of the annular electrode onto the base substrate overlap the orthographic projection of the second signal line 252 onto the base substrate among four corner portions of the annular electrode 230 is reduced, and the line width of the annular electrode 230 at the other two corner portions A and C at which the orthographic projection of the annular electrode onto the base substrate overlap the orthographic projection of the third signal line onto the base substrate is not reduced.

Figure 11:
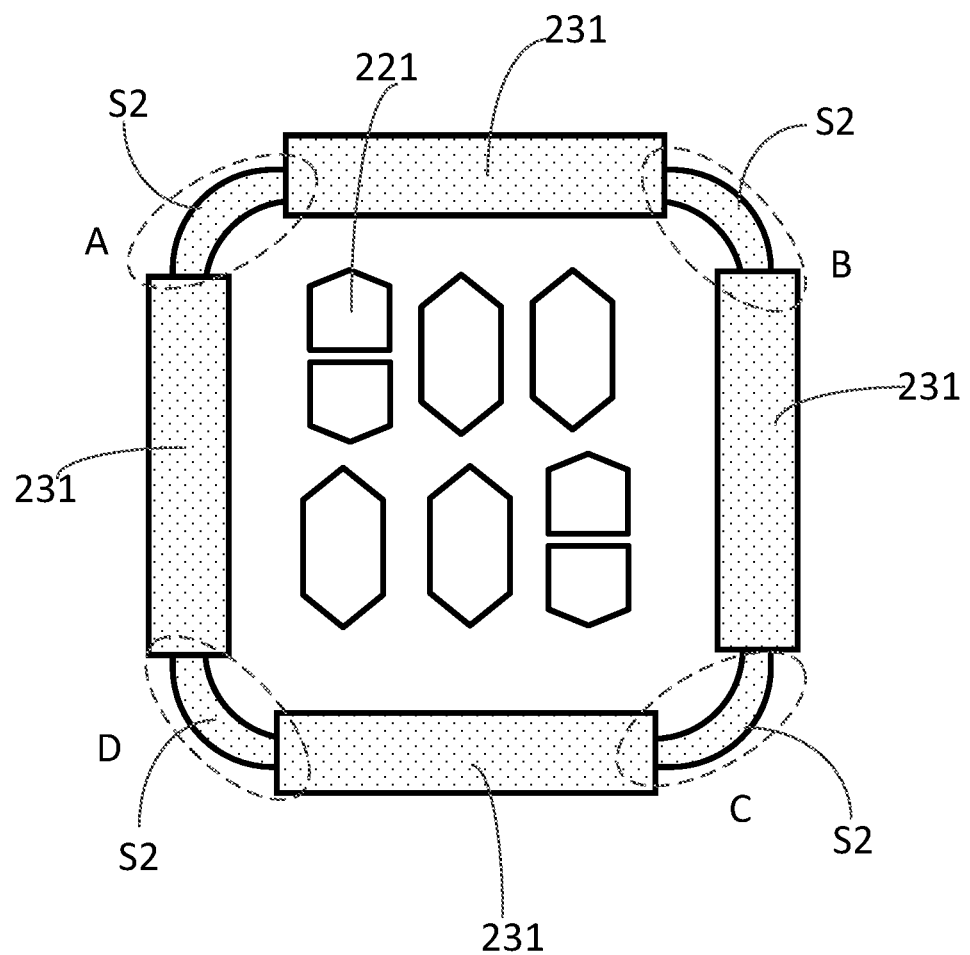
FIG. 11 is yet another schematic view showing the annular electrode in the display substrate according to some embodiments of the present disclosure.

In some practical applications, in order to further mitigate the short circuit or signal crosstalk defect while increasing the wiring space, the line width of the annular electrode 230 at the overlapping region between the third signal line and the annular electrode 230 may be designed to be less than the line width of the annular electrode in the first region S1, or the annular electrode 230 at the overlapping region is removed to form a hollowed-out region. As shown in FIG. 11, the line width of the annular electrode 230 at four corner portions is reduced and less than that of four side edge portions 231. As shown in FIG. 13, the annular electrode 230 at four corner portions are all removed to form hollowed-out regions, and four side edge portions 231 surrounding at the peripheral side of the display unit 200 are reserved.

Figure 16:
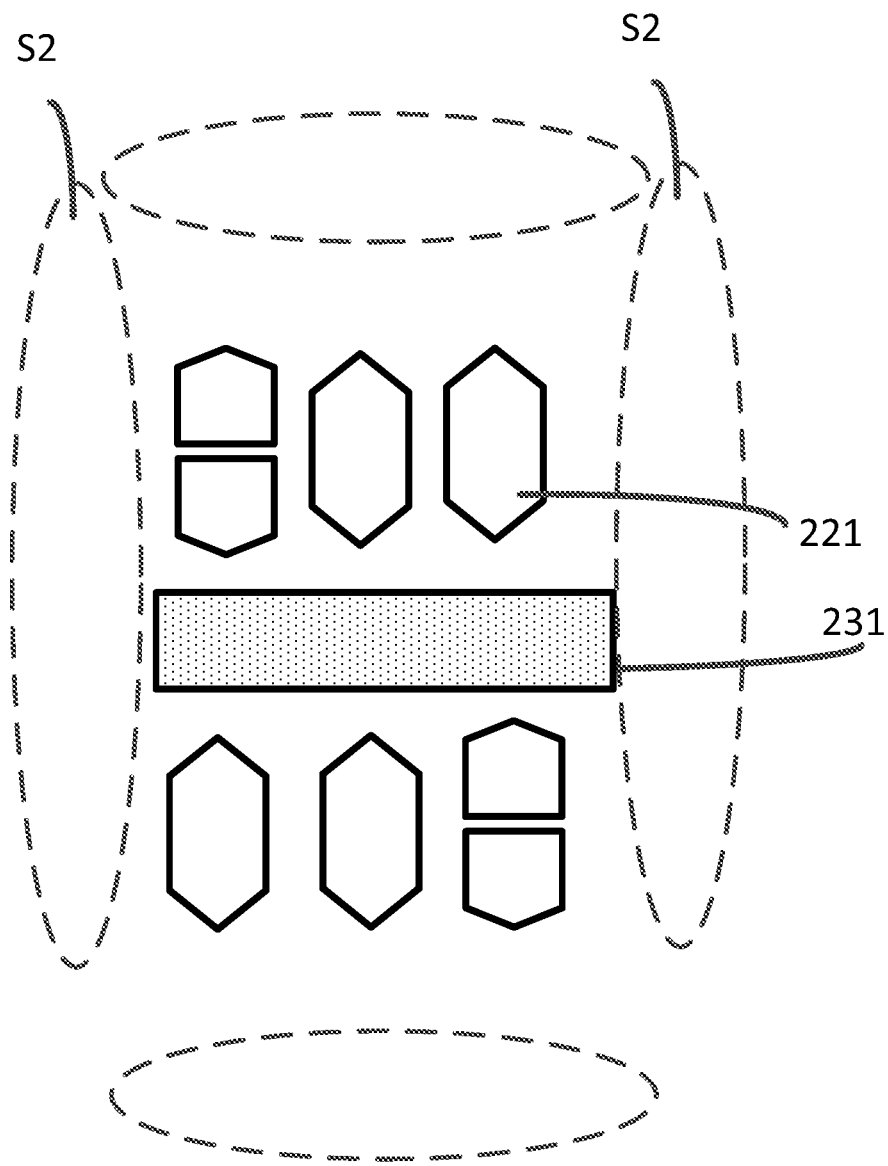
FIG. 16 is a still yet another schematic view showing the annular electrode in the display substrate according to some embodiments of the present disclosure.

In addition, a case where the annular electrode 230 is located at the periphery of the display unit 200 is taken as an example when the above exemplary embodiments are illustrated. In some other embodiments of the present disclosure, as shown in FIG. 16, the orthographic projection of the annular electrode 230 onto the base substrate 100 may be located in the middle of orthographic projections of first electrodes 221 in the corresponding display unit onto the base substrate 100. At this time, the first signal line 251 may be located in the middle of the plurality of signal lines.

It should be appreciated that the above are for illustrative purposes only, in practical applications, the quantity of annular electrodes 230 and the area (the line width and the length) of the annular electrode 230 mainly depend on the quantity of pixels in the corresponding display unit 200. The annular electrode 230 may be of various regular or irregular shapes, and is disposed at the periphery or in the middle of the display unit 200.

Furthermore, in some embodiments of the present disclosure, a contact region at which the first signal line 251 is in contact with the first region S1 may have a width of 2 μm to 30 μm in a line width direction of the first signal line 251. In this way, it is able to meet the requirement that the first signal line 251 is in contact with the first region S1 and form the contact region in a process. In practical applications, the contact region between the first signal line 251 and the first region S1 may be set according to actual needs on the premise that the first signal line 251 is in contact with the first region S1.

Furthermore, in one embodiment of the present disclosure, an orthographic projection of the annular electrode 230 onto the island 110 matches a shape of the island 110. The annular electrode ring 230 may be arranged surrounding the periphery of the island 110. For example, the island 110 is of an approximately rectangular shape, and correspondingly, the annular electrode 230 is of an annular shape that approximates a rectangle. The island 110 is of a circular shape, and correspondingly, the annular electrode 230 is of a circular-annular shape.

Figure 6:
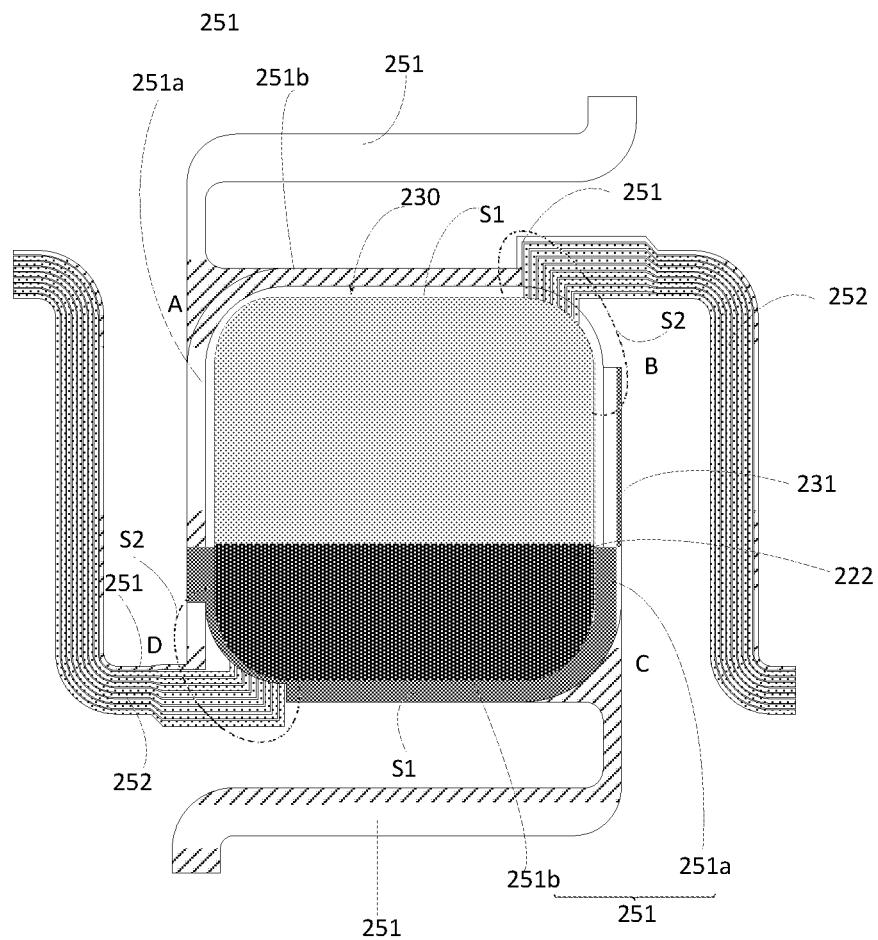
FIG. 6 is another front view of the display substrate where the first electrode, the annular electrode, the first signal line, the second signal line and the second electrode are shown.

Furthermore, in some embodiments of the present disclosure, as shown in FIG. 6, an orthographic projection of the second electrode 222 onto the island 110 covers an orthographic projection of the display unit onto the island 110. The second electrode 222 may fully cover the display unit, one second electrode 222 may correspondingly cover at least one of the display units, and the shape of the second electrode 222 may match the shape of the annular electrode 230. An orthographic projection of the second electrode 222 onto the base substrate 100 at least partially overlaps the orthographic projection of the annular electrode 230 onto the base substrate 100, so as to enable the second electrode 222 to be in contact with the annular electrode 230. It should be appreciated that a contact position between the second electrode 222 and the annular electrode 230 is located in at least a part of an overlapping region therebetween. Illustratively, an edge region of the second electrode 222 partially overlaps the annular electrode 230, so as to enable the second electrode 222 to be in contact with the annular electrode 230.

In one embodiment of the present disclosure, the overlapping region at which the orthographic projection of the second electrode 222 onto the base substrate 100 overlaps the orthographic projection of the electrode ring 230 onto the base substrate 100 is at least located on two opposite sides of the annular electrode 230. That is, the second electrode 222 is in contact with at least two opposite sides of the annular electrode 230, when an area of the display unit is large, i.e., a covering area of the second electrode 222 is large, there may be a non-negligible voltage drop due to a large distance between the two opposite sides of the second electrode 222. In this regard, the two opposite sides of the second electrode 222 may be in contact with the two opposite sides of the annular electrode 230, so as to reduce the voltage drop. It should be appreciated that the second electrode 222 may be in contact with the annular electrode 230 at only one side when the covering area of the second electrode 222 is small, the voltage drop on two opposite sides of the second electrode 222 is negligible.

It should be appreciated that the display substrate in the embodiments of the present disclosure may be a stretchable display substrate. However, the present disclosure is not limited thereto.

In another aspect, the present disclosure further provides in some embodiments a display device including the above-mentioned display substrate.

In yet another aspect, the present disclosure further provides in some embodiments a method for forming the above-mentioned display substrate, including: providing the base substrate 100 including the plurality of islands 110 arranged in an array form and spaced apart from each other and the plurality of connection bridges 120 for connecting each of the plurality of islands 110, forming the plurality of display units 200, the connection unit electrically connecting each of the display units 200 and the annular electrode 230 arranged on each island 110 on the base substrate 100. At least one display unit 200 is arranged on each island 110, the display unit 200 includes a thin film transistor 210 and a light-emitting element 220, the light-emitting element 220 includes a first electrode 221 electrically connected to the thin film transistor 210, a second electrode 222 located at one side of the first electrode 221 away from the base substrate 100 and an electroluminescent layer 223 located between the first electrode 221 and the second electrode 222. The connection unit includes the plurality of signal lines arranged on the connection bridges 120, the orthographic projection of the annular electrode 230 onto the base substrate 100 does not overlap the orthographic projection of the first electrode 221 onto the base substrate 100, and the plurality of signal lines at least includes one or more first signal lines 251 and one or more second signal lines 252. The annular electrode 230 includes a first region S1 and a second region S2, the one or more first signal lines 251 and the second electrode 222 are electrically connected to each other through being in contact with the first region S1, and the one or more second signal lines 252 are electrically connected to the thin film transistor 210 from one of the connection bridges after passing through the second region S2. The line width of the annular electrode 230 in the first region S1 is larger than the line width of the annular electrode 230 in the second region S2, or the second region S2 is a hollowed-out region.

Illustratively, each first signal line 251 and each second signal line 252 are formed through a same patterning process. For example, the metal layer of the source and drain electrodes 212 may be patterned to form the first signal line 251 and the second signal line 252 through a patterning process such as exposure, development and etching.

Illustratively, the annular electrode 230 and the first electrode 221 are formed through a same patterning process. For example, the ITO/Ag/ITO film layer may be patterned to form the first electrode 221 and the annular electrode 230 through a patterning process such as exposure, development and etching.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A display substrate, comprising:
    a base substrate comprising a plurality of islands arranged in an array form and spaced apart from each other and a plurality of connection bridges for connecting each of the plurality of islands;
    a plurality of display units arranged in an array form, wherein at least one display unit is arranged on each island, the display unit comprises a thin film transistor and a light-emitting element, the light-emitting element comprises a first electrode electrically connected to the thin film transistor, a second electrode located at one side of the first electrode away from the base substrate and an electroluminescent layer located between the first electrode and the second electrode; and
    a connection unit for electrically connecting each of the display units, comprising a plurality of signal lines arranged on the connection bridges, wherein
    one or more annular electrodes are further arranged on each island, an orthographic projection of each annular electrode onto the base substrate does not overlap an orthographic projection of the first electrode onto the base substrate, and the plurality of signal lines at least comprises one or more first signal lines and one or more second signal lines;

the annular electrode comprises a first region and a second region, the one or more first signal lines and the second electrode are electrically connected to each other through being in contact with the first region, and the one or more second signal lines are electrically connected to the thin film transistor from one of the connection bridges after passing through the second region, wherein a line width of the annular electrode in the first region is larger than a line width of the annular electrode in the second region, or the second region is a hollowed-out region.

2. The display substrate according to claim 1, wherein each second signal line is arranged at a same layer and made of a same material as each first signal line.

3. The display substrate according to claim 2, wherein at least one source/drain metal layer is arranged on the base substrate, and patterns of the at least one source/drain metal layer comprise patterns of a source electrode and a drain electrode of at least one thin film transistor, the first signal line and the second signal line.

4. The display substrate according to claim 1, wherein the first signal line comprises a first power voltage signal line, and the second signal line comprises at least one of a data signal line and a second power voltage signal line; and/or
wherein the first electrode is an anode, and the second electrode is a cathode.

5. The display substrate according to claim 1, wherein the plurality of connection bridges comprises one or more first bridges arranged in a first stretching direction and one or more second bridges arranged in a second stretching direction crossing the first stretching direction,
wherein at least one of the first signal lines is arranged on the first bridge, and at least one of the second signal lines is arranged on the second bridge.

6. The display substrate according to claim 5, wherein at least one of the first signal lines is arranged on the second bridge and located at an outer position of the plurality of signal lines.

7. The display substrate according to claim 1, wherein the first electrode is arranged at a same layer and made of a same material as the annular electrode, and the first electrode and the annular electrode are insulated from each other.

8. The display substrate according to claim 1, wherein at least one of the annular electrodes is arranged corresponding to one of the display units, and the orthographic projection of the at least one of the annular electrodes onto the base substrate is located at a periphery of orthographic projections of first electrodes in the corresponding display unit onto the base substrate.

9. The display substrate according to claim 8, wherein
the orthographic projection of the annular electrode onto the base substrate is of an annular structure surrounding the periphery of the display unit, wherein the annular electrode comprises four side edge portions surrounding the periphery of the display unit and four corner portions each connecting two adjacent side edge portions, the first region comprises at least one of the side edge portions, and the second region comprises at least one of the corner portions; or,
the annular electrode comprises at least two side edge portions surrounding the periphery of the display unit, at least two adjacent side edge portions are disconnected from each other to form the hollowed-out region, the first region comprises at least one of the side edge portions, and the second region comprises the hollowed-out region; or,
the annular electrode comprises one side edge portion located at a first side of the display unit, the first region comprises the one side edge portion, and the second region comprises hollowed-out regions at other sides of the display unit except the first side; or,
the orthographic projection of the annular electrode onto the base substrate is of an annular structure surrounding the periphery of the display unit, the annular electrode comprises at least two arc-like portions and at least two corner portions each connecting two adjacent arc-like portions, the first region comprises at least one of the arc-like portions, and the second region comprises at least one of the corner portions.

10. The display substrate according to claim 9, wherein the corner portion is an arc-shaped corner and an orthographic projection of the corner portion onto the base substrate is of an arc-like shape.

11. The display substrate according to claim 10, wherein at least one arc-shaped corner is of a circular arc-like shape protruding toward an outer side of the annular structure, and/or, at least one arc-shaped corner is of a circular arc-like shape protruding toward an inner side of the annular structure.

12. The display substrate according to claim 1, wherein one of the annular electrodes is arranged corresponding to one of the display units, and the orthographic projection of the annular electrode onto the base substrate is located in the middle of orthographic projections of first electrodes in the corresponding display unit onto the base substrate, and the one or more first signal lines are located in the middle of the plurality of signal lines.

13. The display substrate according to claim 1, wherein the plurality of signal lines further comprises a plurality of third signal lines located on one side of the one or more first signal lines and the one or more second signal lines close to the base substrate, wherein a line width of the annular electrode in an overlapping region at which an orthographic projection of each third signal line onto the base substrate overlaps the orthographic projection of the annular electrode onto the base substrate is less than or equal to the line width of the annular electrode in the first region, or the overlapping region is a hollowed-out region.

14. The display substrate according to claim 1, wherein a contact region at which the one or more first signal lines are in contact with the first region has a width of 2 μm to 30 μm in a line width direction of each first signal line.

15. The display substrate according to claim 1, wherein an orthographic projection of the annular electrode onto the island matches a shape of the island; and/or
wherein an orthographic projection of the second electrode onto the island covers an orthographic projection of the display unit onto the island and at least partially overlaps the orthographic projection of the annular electrode onto the base substrate.

16. The display substrate according to claim 15, wherein an overlapping region at which an orthographic projection of the second electrode onto the base substrate overlaps the orthographic projection of the annular electrode onto the base substrate is at least located on two opposite sides of the annular electrode.

17. The display substrate according to claim 1, wherein the display substrate is a stretchable display substrate.

18. A display device, comprising the display substrate according to claim 1.

19. A method for forming the display substrate according to claim 1, comprising:
providing the base substrate comprising the plurality of islands arranged in an array form and spaced apart from each other and the plurality of connection bridges for connecting each of the plurality of islands;
forming the plurality of display units, the connection unit for electrically connecting each of the display units and the annular electrode arranged on each island on the base substrate, wherein at least one display unit is arranged on each island, the display unit comprises a thin film transistor and a light-emitting element, the light-emitting element comprises a first electrode electrically connected to the thin film transistor, a second electrode located at one side of the first electrode away from the base substrate and an electroluminescent layer located between the first electrode and the second electrode; the connection unit comprises the plurality of signal lines arranged on the connection bridges, the orthographic projection of the annular electrode onto the base substrate does not overlap the orthographic projection of the first electrode onto the base substrate, and the plurality of signal lines at least comprises one or more first signal lines and one or more second signal lines; the annular electrode comprises a first region and a second region, and the one or more first signal lines and the second electrode are electrically connected to each other through being in contact with the first region, the one or more second signal lines are electrically connected to the thin film transistor from one of the connection bridges after passing through the second region; the line width of the annular electrode in the first region is larger than the line width of the annular electrode in the second region, or the second region is a hollowed-out region.

20. The method according to claim 19, wherein each first signal line and each second signal line are formed through a same patterning process;
the first electrode and the annular electrode are formed through a same patterning process.

* * * * *